(12) United States Patent
Son et al.

(10) Patent No.: US 12,719,028 B2
(45) Date of Patent: Aug. 25, 2026

(54) SUBSTRATE PROCESSING DEVICE

(71) Applicant: SEMES CO., LTD., Cheonan-si (KR)

(72) Inventors: Hyoungkyu Son, Seoul-si (KR); Jaewoong Sim, Hwaseong-si (KR); Donguk Kim, Hwaseong-si (KR); Yunsang Kim, Seongnam-si (KR); Inhoe Kim, Seoul-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 663 days.

(21) Appl. No.: 18/298,551

(22) Filed: Apr. 11, 2023

(65) Prior Publication Data

US 2023/0369029 A1 Nov. 16, 2023

(30) Foreign Application Priority Data

May 16, 2022 (KR) ........................ 10-2022-0059725

(51) Int. Cl.
*H01J 37/32* (2006.01)

(52) U.S. Cl.
CPC .. *H01J 37/32642* (2013.01); *H01J 37/32697* (2013.01); *H01J 37/32724* (2013.01); *H01J 37/32082* (2013.01); *H01J 2237/002* (2013.01); *H01J 2237/2007* (2013.01)

(58) Field of Classification Search
None
See application file for complete search history.

(56) References Cited

U.S. PATENT DOCUMENTS 6,036,878 A * 3/2000 Collins ............ H01J 37/32458 216/68
10,109,510 B2 10/2018 Anella et al.
10,512,125 B2 12/2019 Kitagawa
10,593,520 B2 3/2020 Wu et al.
11,062,885 B2 7/2021 Sim et al.
2010/0243620 A1* 9/2010 Yamawaku ....... H01J 37/32623 219/121.54
2012/0281334 A1* 11/2012 Sasaki ............... H01J 37/32642 361/234

FOREIGN PATENT DOCUMENTS

CN 1737991 A * 2/2006 ........ H01J 37/32522
JP H06-196443 A 7/1994
JP 6452449 B2 1/2019
KR 10-2017-0076572 A 7/2017
KR 10-2017-0095983 A 8/2017
KR 10-2018-0125091 A 11/2018
KR 102039969 B1 11/2019
KR 10-2021-0016848 A 2/2021

OTHER PUBLICATIONS

Korean Notice of Allowance dated Oct. 17, 2024 issued in corresponding Korean Appln. No. 10-2022-0059725.
Korean Office Action dated Feb. 13, 2024 issued in corresponding Korean Appln. No. 10-2022-0059725.

* cited by examiner

*Primary Examiner* — Jason Berman
(74) *Attorney, Agent, or Firm* — Harness, Dickey & Pierce, P.L.C.

(57) ABSTRACT

A substrate processing device is provided. The substrate processing device includes: a substrate supporter configured to support a substrate; a heating ring horizontally surrounding the substrate supporter; and an edge ring horizontally surrounding the heating ring and configured to cover a top surface of the heating ring.

19 Claims, 5 Drawing Sheets

FIG. 2

SUBSTRATE PROCESSING DEVICE

CROSS-REFERENCE TO RELATED APPLICATION

This application is based on and claims priority under 35 U.S.C. § 119 to Korean Patent Application No. 10-2022-0059725, filed on May 16, 2022, in the Korean Intellectual Property Office, the disclosure of which is incorporated by reference herein in its entirety.

BACKGROUND

1. Field

One or more embodiments relate to a substrate processing device.

2. Description of Related Art

Generally, a semiconductor device may be manufactured through various substrate processing processes, such as an oxidation process, a photo process, an etching process, a deposition process, etc. Plasma may be used in a substrate processing process. Plasma refers to an ionized gas state including an ion, electron, radical, etc. and may be generated by high-temperature or strong electric-fields or radio frequency electric fields.

As the semiconductor device has an increased degree of integration, the importance of fine patterning has increased, and uniform plasma distribution is required in the substrate processing process using plasma. In order to concentrate plasma in an upper portion of a substrate, an edge ring may be arranged to surround the substrate.

SUMMARY

The disclosure provides a substrate processing device with improved reliability and durability.

Additional aspects will be set forth in part in the description which follows and, in part, will be apparent from the description, or may be learned by practice of the presented embodiments of the disclosure.

One or more embodiments include a substrate processing device. According to one or more embodiments, a substrate processing device includes: a substrate supporter configured to support a substrate; a heating ring horizontally surrounding the substrate supporter; and an edge ring horizontally surrounding the heating ring and configured to cover a top surface of the heating ring.

The heating ring may include a heating electrode arranged to be vertically adjacent to the edge ring.

The heating electrode may be configured to horizontally surround the substrate supporter.

The substrate processing device may further include a cooling ring arranged between the heating ring and the edge ring and horizontally surrounding the heating ring, wherein the edge ring may be configured to cover a top surface of the cooling ring and the top surface of the heating ring.

The top surface of the cooling ring may be at a same vertical level as a top surface of the substrate supporter.

The cooling ring may include a cooling channel through which a cooling fluid circulates.

The substrate processing device may further include a silicon (Si) pad arranged between the top surface of the heating ring and the edge ring and between the top surface of the cooling ring and the edge ring.

The substrate processing device may further include a thermal insulation ring arranged between the substrate supporter and the heating ring and horizontally surrounding the substrate supporter.

The thermal insulation ring may include polytetrafluoroethylene and carbon materials.

The substrate supporter may be configured to cool the substrate to a temperature in a range of about −60° C. to about −150° C.

According to one or more embodiments, a substrate processing device is provided. The substrate processing device includes: a substrate supporter configured to support a substrate; a heating ring horizontally surrounding the substrate supporter; a cooling ring horizontally surrounding the heating ring; and an edge ring horizontally surrounding the heating ring, wherein the edge ring is configured to cover top surfaces of the heating ring and the cooling ring.

The heating ring may include a heating electrode configured to horizontally surround the substrate supporter, and the heating electrode may be arranged to be vertically adjacent to the edge ring.

The top surface of the cooling ring may be at a same vertical level as a top surface of the substrate supporter.

The substrate processing device may further include a first thermal insulation ring horizontally surrounding the substrate supporter between the heating ring and the substrate supporter, and a second thermal insulation ring horizontally surrounding the heating ring between the cooling ring and the heating ring.

A temperature of a first surface, which is a top surface of a portion of the edge ring covering the heating ring, may be greater than a temperature of a second surface, which is a top surface of a portion of the edge ring covering the cooling ring.

The second surface may be at a higher vertical level than the first surface.

According to one or more embodiments, a substrate processing device is provided. The substrate processing device includes: a substrate supporter including a support puck configured to support a substrate on a top surface thereof by generating an electrostatic tensile force and a chuck body arranged on a bottom surface of the support puck and configured to cool the support puck; a heating ring horizontally surrounding the substrate supporter; a cooling ring horizontally surrounding the heating ring; a base plate arranged on bottom surfaces of the substrate supporter, the heating ring, and the cooling ring and configured to receive radio frequency (RF) power; and an edge ring horizontally surrounding the cooling ring and the base plate and configured to cover top surfaces of the heating ring and the cooling ring.

The top surface of the cooling ring may be at a same vertical level as a top surface of the support puck.

The cooling ring may include a second cooling channel through which a coolant circulates, and the base plate may include a second connection channel connected through the second cooling channel and through which the coolant flows.

The heating ring may include a heating electrode configured to horizontally surround the substrate supporter, and the heating electrode may be electrically connected to a second conductive line surrounded by an insulating material and configured to penetrate the base plate.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a cross-sectional view of a substrate processing device according to embodiments;

DETAILED DESCRIPTION

Figure 1:
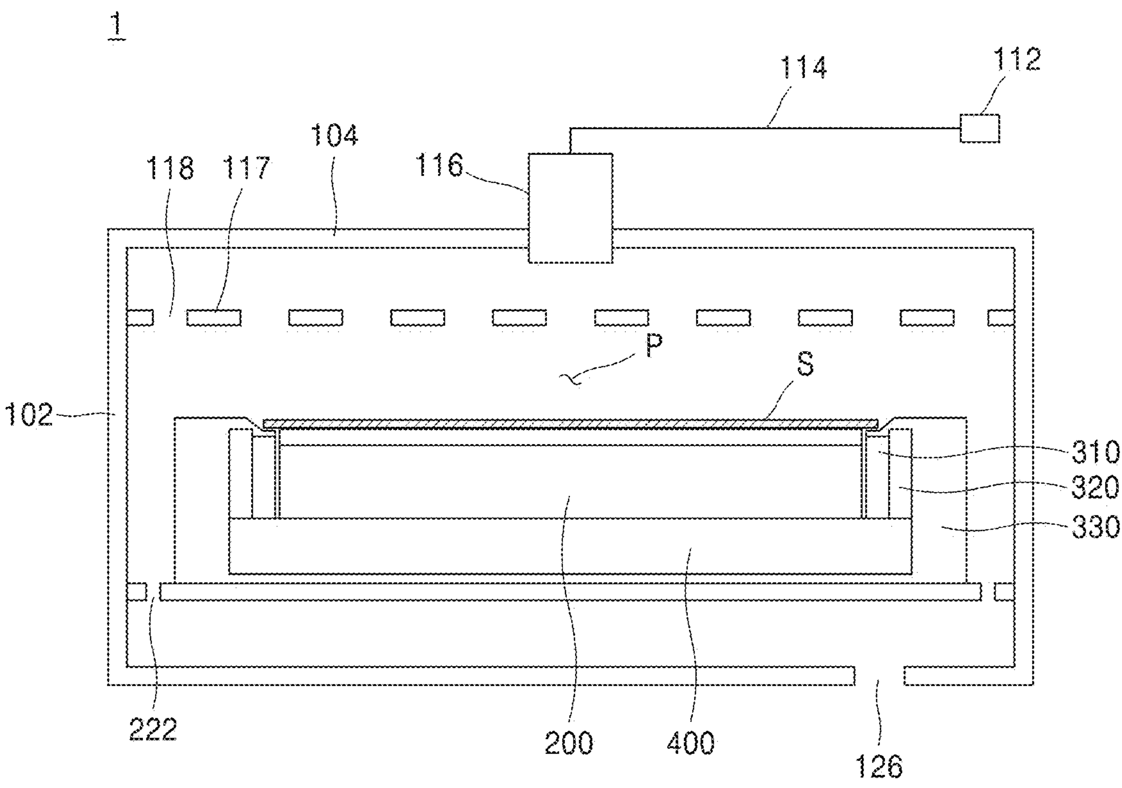
FIG. 1 is a cross-sectional view of a chamber including a substrate processing device according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments are described in detail with reference to the accompanying drawings. The same components on the drawings are referred to by using the same reference numerals, and the same descriptions are not repeatedly given.

FIG. 1 is a cross-sectional view of a chamber 1 including a substrate processing device 500 according to embodiments.

Referring to FIG. 1, the chamber 1 may include a plasma gas supply unit, the substrate processing device 500, and a discharge unit.

The plasma source supply unit may include a plasma source injector 116 configured to inject a plasma source into the chamber 1, a plasma source tank 112 configured to supply the plasma source, a plasma source channel 114 configured to allow the plasma source to flow from the plasma source tank 112 to the plasma source injector 116, and a plasma source injection plate 117 configured to inject the plasma source onto a substrate S. The plasma source injection plate 117 may include a plurality of injection holes 118 configured to uniformly inject the plasma source onto a top surface of the substrate S. The plasma source may be flown into the chamber 1 in a gas state.

The substrate processing device 500 may be configured to support the substrate S. The substrate processing device 500 may be arranged to be apart from the plasma source injection plate 117. In this case, a plasma processing space P may be provided between the substrate S and the plasma source injection plate 117.

According to embodiments, the plasma source injector 116 and the plasma source injection plate 117 may be arranged at an upper portion of the chamber 1, the substrate processing device 500 may be arranged to be vertically apart from the plasma source injection plate 117, and the discharge unit may be arranged below the substrate processing device 500. The discharge unit may be arranged at a lower portion of the chamber 1 and may be configured to discharge by-products including particles, fumes, etc., generated in a process of processing the substrate S, to the outside. The discharge unit may include a discharge hole 122, an accommodation portion 124, and a discharge line 126. For example, the by-products scattered in the substrate processing process may flow into the accommodation portion 124 through the discharge hole 122 and may be discharged to the outside of the chamber 1 through the discharge line 126. For example, the by-products may be discharged to the outside of the chamber 1 through a vacuum pump (not shown) connected to the discharge line 126 and configured to decompress the chamber 1.

Figure 2:
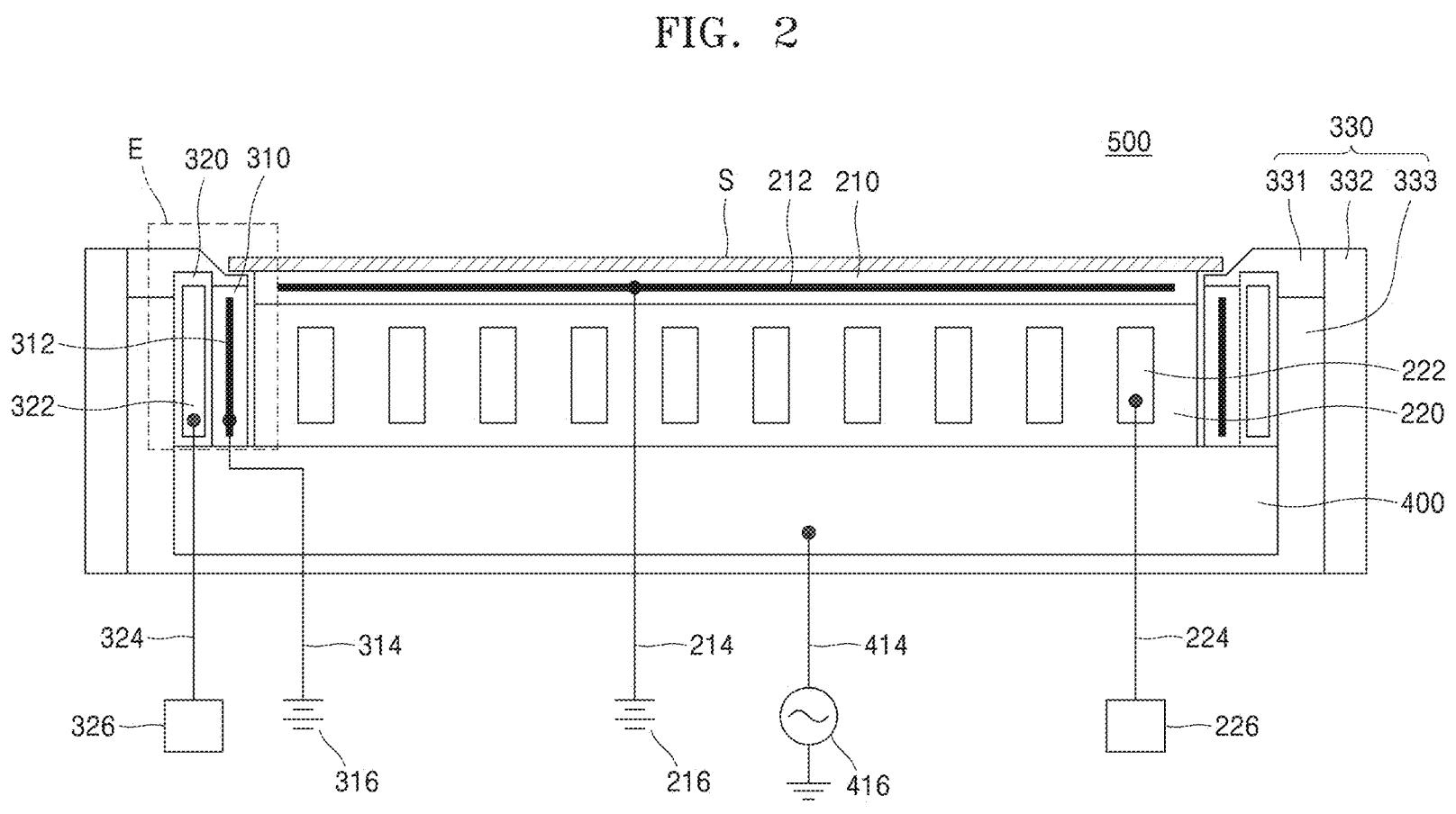
Figure 3:
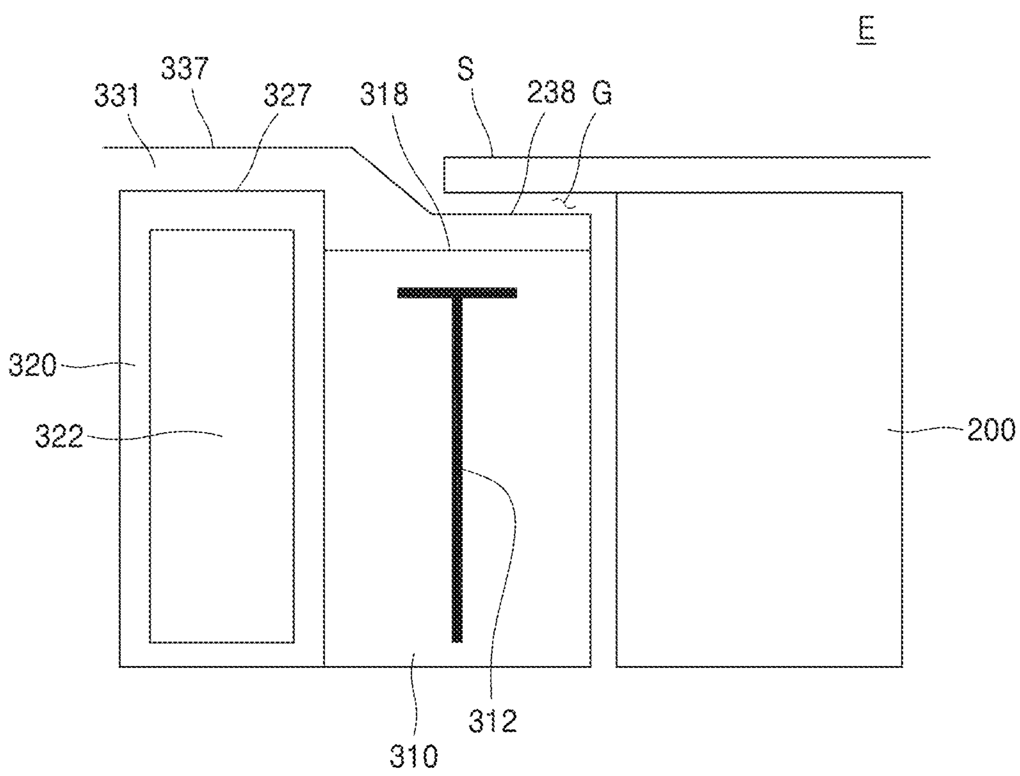
FIG. 3 is a cross-sectional view of a substrate processing device, the cross-sectional view showing an enlarged edge area.

FIG. 2 is a cross-sectional view of the substrate processing device 500 according to embodiments. FIG. 3 is an enlarged view of an edge area E of the substrate processing device 500 illustrated in the cross-sectional view of FIG. 2, according to embodiments.

Referring to FIGS. 2 and 3, the substrate processing device 500 may include a substrate supporter 200, a base plate 400, a heating ring 310, a cooling ring 320, and an edge ring 330.

According to embodiments, the substrate supporter 200 may include a support puck 210 configured to support the substrate S and a chuck body 220 arranged at a bottom surface of the support puck 210. The support puck 210 and the chuck body 220 may be bonded to each other through a bonder. For example, the bonder may include an organic bonder and a silicon bonder. According to embodiments, the base plate 400 may be provided as a basic frame of the substrate supporter 200 and may be arranged at a bottom surface of the chuck body 220. The base plate 400 may include channels 324 and 414 through which a cooling fluid and cooling water described below may flow. Also, the base plate 400 may be penetrated by a first conductive line 214 and a second conductive line 314 configured to connect a chucking electrode 212 and a heating electrode 312 with power supplies 216 and 316.

According to embodiments, the support puck 210 may be configured to generate an electrostatic tensile force to support the substrate S on a top surface thereof. According to some embodiments, the support puck 210 may include a chucking electrode 212 inside thereof. For example, the chucking electrode 212 may be horizontally arranged on a top surface of the support puck 210 in the support puck 210 and may include a first electrode (not shown) and a second electrode (not shown) arranged symmetrically with each other and to be apart from each other. The first electrode and the second electrode may be provided as a positive electrode and a negative electrode, respectively. For example, a portion of the support puck 210, the portion surrounding the chucking electrode 212, may include a dielectric material. The substrate S may be fixed to the support puck 210 by an electrostatic tensile force generated by a positive charge of the first electrode and a negative charge of the second electrode.

According to some embodiments, the dielectric material may include a ceramic material. Examples of the ceramic material may include, but are not limited to, aluminum nitride (AlN), oxide aluminum $Al_2O_3$, titanium nitride (TiN), titanium oxide (TiO), and silicon carbide (SiC).

According to some embodiments, the chucking electrode 212 may be electrically connected to the first power supply portion 216 by the first conductive line 214. For example, the first conductive line 214 may be surrounded by an insulating material and configured to penetrate the base plate 400 and the chuck body 220, and the first power supply portion 216 may be configured to generate direct current (DC) power and supply the power to the chucking electrode 212.

According to embodiments, the support puck 210 may include a protrusion portion (not shown) protruding by a predetermined height on a top surface thereof. The protrusion portion may include a plurality of convex portions (not shown) and groove portions (not shown) defined as spaces between the convex portions. When the substrate S is supported on the support puck 210, a bottom surface of the substrate S may contact the convex portions, and the groove portions may be provided as gap spaces between the substrate S and the support puck 210. According to some embodiments, the groove portions may be provided as fluid channels through which a cooling fluid flows. For example, the cooling fluid may flow into the groove portions of the support puck 210 through a cooling fluid transport pipe (not shown) configured to penetrate the base plate 400 and the substrate supporter 200. Accordingly, the bottom surface of the substrate S may directly contact the cooling fluid, so as to be rapidly cooled. For example, the cooling fluid may include He.

According to embodiments, the chuck body 220 may be arranged at a lower portion of the support puck 210 and may be configured to cool the substrate S. According to some embodiments, the chuck body 220 may include a first cooling channel 222 inside thereof, and the first cooling channel 222 may be provided as a space through which a coolant circulates. According to some embodiments, the first cooling channel 222 may have a shape in which a plurality of channels are arranged in the chuck body 220 to be apart from each other by a predetermined distance, wherein the plurality of channels may be connected to each other so that the coolant may flow through the plurality of channels. For example, the chuck body 220 may include an Al alloy. For example, the coolant may include a fluorine refrigerant.

According to some embodiments, a first connection channel 224 may be connected to a first coolant tank 226 and configured to allow a coolant to flow into the first cooling channel 222. The first connection channel 224 may be configured to penetrate the base plate 400, and the first coolant tank 226 may be configured to circulate the coolant, based on temperature information of the first cooling channel 222 sensed by a temperature sensor, etc. For example, the first connection channel 224 may be configured to form a fluid passage in the base plate 400 and may be connected through the first cooling channel 222 and the first coolant tank 226.

In a peripheral area (hereinafter, an edge area E) of the substrate S including a circumference of the substrate S, a gap space (hereinafter, a gap G) may be formed between the substrate S and the peripheral members and between the peripheral members. For example, when the substrate S is supported on the substrate supporter 200, a gap G may be formed between the substrate S and another arbitrary member of the substrate processing device (hereinafter, a side surface member) horizontally surrounding an outer surface of the substrate supporter 200 and between the substrate supporter 200 and the side surface member.

The gap G may have a size varying according to a temperature, a contraction rate, etc. of the substrate S, the substrate supporter 200, and the side surface member. For example, when the substrate supporter 200 is cooled, a gap G may be formed between the substrate supporter 200 and the side surface member due to cooling contraction, and in a relatively high-temperature environment, the gap G may not be substantially formed between the substrate supporter 200 and the side surface member.

According to some embodiments, by-products generated in a substrate processing process may be stuck into the gap G or may adhere to surfaces of the substrate S, the substrate supporter 200, and the side surface member surrounding the gap G. For example, by-products generated in a plasma process may include particles or fumes of the substrate S, an injected plasma source, and reactants thereof. For example, the by-product in the form of polymers may be deposited on the surfaces of the substrate S of the edge area E, the substrate supporter 200, and the side surface member. The by-products may have high reactivity during the plasma process, and thus, may cause process defects, such as an arc discharge, etc.

According to some embodiments, the substrate supporter 200 may be configured to cool the substrate S in a substrate processing process. For example, the substrate S may have an increased temperature due to collision of a plasma source, etc. in the plasma process, and the substrate supporter 200 may be configured to cool the substrate S in order to increase a yield rate. For example, the substrate supporter 200 may be configured to adjust a temperature of the substrate S in a range between −60° C. and −150° C.

Due to the cooling of the substrate supporter 200, the amount of by-products deposited in the edge area E may increase. According to some embodiments, due to the cooling of the substrate supporter 200, a gap G may be formed between the substrate supporter 200 and another member adjacent to the substrate supporter 200. In this case, the amount of by-products deposited on the surfaces of the members surrounding the edge area E including a circumference of the substrate S and the gap G may increase, and process defects may occur.

According to embodiments, the heating ring 310 may be arranged to horizontally surround the substrate supporter 200. According to embodiments, the edge ring 330 may be arranged to horizontally surround the heating ring 310 and configured to cover a top surface 318 of the heating ring 310. According to some embodiments, the edge ring 330 may be configured to surround an outer surface of the heating 310 and the top surface 318 of the heating ring 310 with respect to a central axis of the substrate supporter 200. For example, the edge ring 330 may include a portion horizontally surrounding the heating ring 310 at an outer portion of the heating ring 310 and a portion covering the top surface 318 of the heating ring 310 and horizontally surrounding the substrate supporter 200 at an outer portion of the substrate supporter 200.

According to some embodiments, the top surface 318 of the heating ring 310 may be arranged at a vertically lower level than a top surface 208 of the substrate supporter 200. According to some embodiments, a first surface 338, which is a top surface of a portion of the edge ring 330 covering the top surface 318 of the heating ring 310 and horizontally surrounding the substrate supporter 200 at the outer portion of the substrate supporter 200, may be at a vertically lower level than the top surface 208 of the substrate supporter 200. For example, when the substrate S is supported by the substrate supporter 200, a gap G may be formed among a bottom surface of the substrate S, the first surface 338, and an outer surface of the substrate supporter 200. For example, a gap G may be formed between the outer surface of the substrate supporter 200 and an inner surface of the heating ring 310.

According to embodiments, the heating ring 310 may be configured to heat the edge area E. For example, the heating ring 310 may be configured to heat the first surface 338.

According to embodiments, the heating ring 310 may include the heating electrode 312 inside thereof, and the heating electrode 312 may be arranged to be vertically adjacent to the edge ring 330. For example, from a relative perspective, a temperature of the first surface 338 may be greater than a temperature of the top surface 208 of the substrate supporter 200 and a temperature of a top surface of the substrate S. In this case, the first surface 338 may transfer heat in a direction perpendicular to the first surface 338 and heat convection may occur in a direction away from the first surface 338. Thus, by-products may be diffused in the direction away from the first surface 338. For example, the amount of by-products flowing into the gap G adjacent to the first surface 338 may decrease, and the amount of by-products deposited on the first surface 338 may decrease. Accordingly, the lifespan characteristic of the substrate processing device 500 may be improved, and a replacement cycle of the edge ring 330 may be extended.

According to some embodiments, the heating ring 310 may extend along an outer surface of the substrate supporter 200 and may have a closed ring shape surrounding the substrate supporter 200. Each heating electrode 312 may be arranged to be apart from each other by a predetermined distance in a direction in which the heating ring 310 extends. In this case, the heating ring 310 may be uniformly heated along the extension direction of the heating ring 310. Accordingly, the heating ring 310 may be uniformly heated, and mechanical stability of the substrate processing device 500 may be improved.

Figure 4:
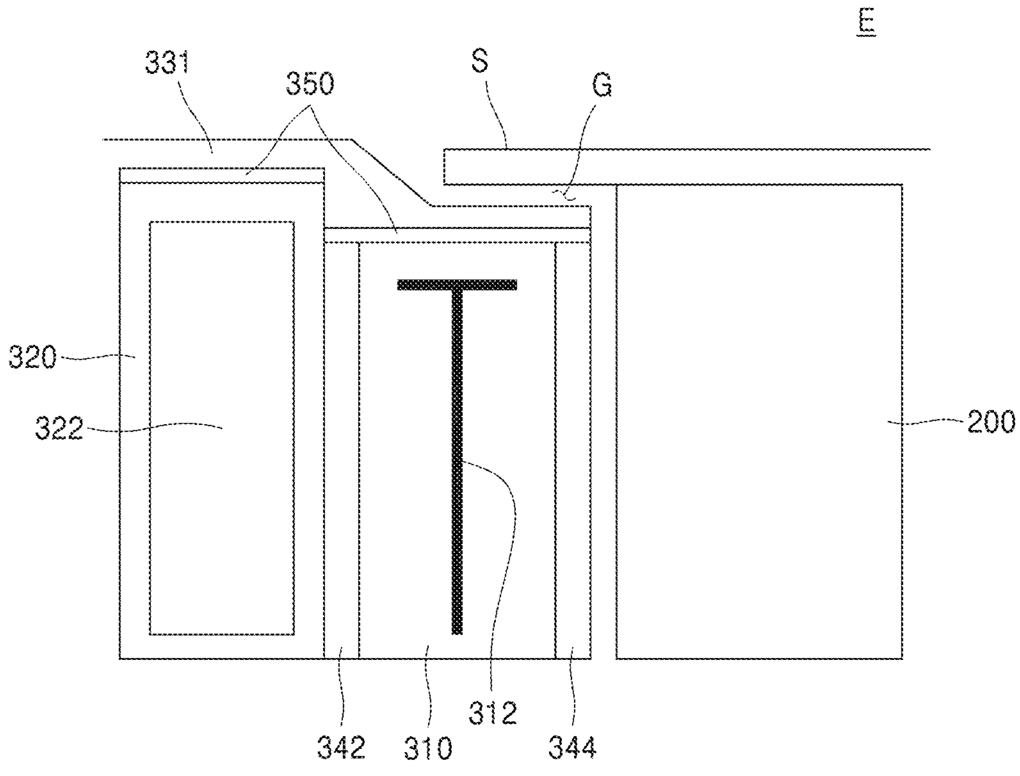
FIG. 4 is a perspective view of a heating electrode of a heating ring according to embodiments.

FIG. 4 is a perspective view of the heating electrode 312 of the heating ring 310 according to embodiments.

According to embodiments, the heating electrode 312 may include a first heating electrode 313 extending in a direction perpendicular to a top surface of the base plate 400. According to some embodiments, the heating ring 310 may include a plurality of first heating electrodes 313, and the plurality of first heating electrodes 313 may be arranged to be apart from each other by a predetermined distance in an extension direction of the heating ring 310. For example, the plurality of first heating electrodes 313 may be arranged to be apart from each other by a predetermined distance and may horizontally surround the substrate supporter 200.

According to embodiments, the heating electrode 312 may include a second heating electrode 315 extending in a direction that is the same as the horizontal extension direction of the heating ring 310. For example, the second heating electrode 315 may extend to horizontally surround the substrate supporter 200 and may have a closed ring shape. According to embodiments, the second heating electrode 315 may be arranged to be vertically adjacent to the edge ring 330. For example, the second heating electrode 315 may be arranged to be adjacent to a first surface. According to some embodiments, although not shown in FIG. 4 the heating ring 310 may include a plurality of second heating electrodes 315. For example, the plurality of second heating electrodes 315 may arranged to be apart from each other by a predetermined distance and may be arranged at vertically different levels from each other.

However, the plurality of second heating electrodes 315 are not limited thereto, and the heating electrode 312 may be radially symmetrically arranged based on the central axis of the substrate supporter 200. Accordingly, non-uniform heating of the heating ring 310 may be prevented, and a process defect due to deformation of the heating ring 310 may be prevented.

According to some embodiments, the heating electrode 312 may be electrically connected to the second power supply portion 316 by the second conductive line 314. For example, the second conductive line 314 may be surrounded by an insulating material and configured to penetrate the base plate 400, and the second power supply portion 315 may be configured to generate DC power and supply the power to the heating electrode 312. For example, the heating electrode 312 may be electrically connected to the second conductive line 314 on a surface on which the heating ring 310 and the base plate 400 contact each other.

According to embodiments, the cooling ring 320 may be arranged between the heating ring 310 and the edge ring 330. For example, the cooling ring 320 may horizontally surround the heating ring 310, and the edge ring 330 may horizontally surround the cooling ring 320. According to embodiments, an edge ring 330 may be configured to cover a top surface 327 of the cooling ring 320 and the top surface 318 of the heating ring 310. For example, the edge ring 330 may be configured to surround an outer surface of the cooling ring 320, a top surface 327 of the cooling ring 320, and the top surface 318 of the heating ring 310. For example, the edge ring 330 may include a portion horizontally surrounding the heating ring 310 and a portion covering the top surface 318 of the heating ring 310 and the top surface 327 of the cooling ring 320 and horizontally surrounding the substrate supporter 200.

According to embodiments, the cooling ring 320 may be configured to reduce a temperature of a portion arranged at a further outer portion than the heating ring 310 with respect to the central axis of the substrate supporter 200 to be relatively lower than a temperature of a portion adjacent to the heating ring 310. According to some embodiments, a temperature of a second surface 337, which is a top surface of a portion of the edge ring 330 covering the top surface 327 of the cooling ring 320, may be lower than a temperature of a first surface 338, which is a top surface of a portion of the edge ring 330 covering the top surface 318 of the heating ring 310. For example, the first surface 338 may be arranged below a circumferential portion of the substrate S to be apart from the substrate S by a predetermined distance to form a gap G, and the second surface 337 may be arranged at an outer portion farther away from the gap G than the first surface 338 with respect to the central axis of the substrate supporter 200. In this case, by-products generated in the plasma process may be diffused in a direction toward the second surface 337. For example, the by-products diffused in a direction away from the first surface 338 and the gap G may move to the second surface 337 having a relatively lower temperature. In this case, the by-products may be guided to be deposited on the second surface 337 which is further outside than the first surface 338 with respect to the central axis of the substrate supporter 200. Accordingly, the amount of by-products stuck into the gap G or deposited on surfaces of members of the substrate supporter 200 surrounding the gap G may be reduced, and the lifespan characteristic of the substrate processing device 500 may be improved.

According to some embodiments, the cooling ring 320 may include a second cooling channel 322 inside thereof, and the second cooling channel 322 may be provided as a space through which a coolant circulates. According to some embodiments, the second cooling channel 322 may extend in a direction perpendicular to the base plate 400. For example, the cooling ring 320 may include a plurality of second cooling channels 322, and the plurality of second cooling channels 322 may be arranged to be apart from each other by a predetermined distance and may horizontally surround the heating ring 310. According to some embodiments, the second cooling channel 322 may extend to horizontally surround the heating ring 310.

According to some embodiments, the second cooling channel 322 may be arranged at the vertically same level as the heating electrode 312 and may be arranged to horizontally surround the heating electrode 312. In this case, the amount of heat generated by the heating electrode 312 and transferred to the edge ring 330 may be reduced, and a temperature of the second surface 337 may be maintained to be lower than a temperature of the first surface 338. Accordingly, thermal deformation of the edge ring 330 may be prevented, and process defects due to by-products deposition may be reduced.

According to some embodiments, a second connection channel 324 may be connected to a second coolant tank 326 and configured to allow a coolant to flow into the second cooling channel 322. The second connection channel 324 may be configured to penetrate the base plate 400, and the second coolant tank 326 may be configured to sense a temperature of the second cooling channel 322 and circulate the coolant. For example, the second connection channel 324 may be configured to form a fluid passage in the base plate 400 to be connected through the second cooling channel 322 and the second coolant tank 326.

According to embodiments, the top surface 327 of the cooling ring 320 may be at the vertically same level as the top surface 208 of the substrate supporter 200. For example, the top surface 327 of the cooling ring 320 may be at the vertically same level as a top surface of the support puck 210. Accordingly, plasma may be concentrated on the substrate S and may be guided to be horizontally uniformly distributed on the substrate S. According to some embodiments, the top surface 318 of the heating ring 310 may be at a vertically lower level than the top surface 208 of the substrate supporter 200, and a step difference may be formed between the top surface 208 of the substrate supporter 200 and the top surface 318 of the heating ring 310 and between the top surface 318 of the heating ring 310 and the top surface 327 of the cooling ring 320. For example, a top surface of an assembly of the substrate supporter 200, the heating ring 310, and the cooling ring 320 may have a groove shape extending in an extension direction of the heating ring 310.

According to embodiments, the heating ring 310 and the cooling ring 320 may include metal. According to some embodiments, the heating ring 310 and the cooling ring 320 may include the same metal. For example, the heating ring 310 and the cooling ring 320 may include an Al alloy.

Figure 5:
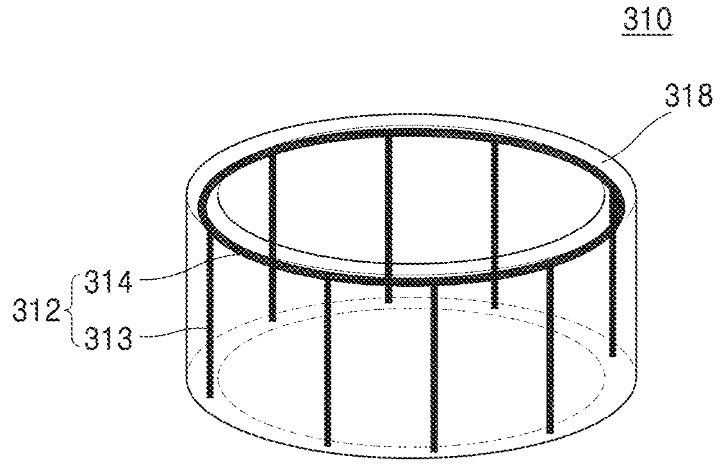
FIG. 5 is a cross-sectional view of a substrate processing device, the cross-sectional view showing an enlarged edge area, according to embodiments which are different from the embodiments of FIG. 3.

FIG. 5 is an enlarged cross-sectional view of the edge area E of the substrate processing device 500 according to embodiments. A difference between FIGS. 3 and 5 may be whether or not a silicon (Si) pad 350 and a thermal insulation ring 340 are provided. Hereinafter, descriptions are to be given based on the difference.

According to embodiments, the Si pad 350 may be arranged between the top surface 318 of the heating ring 310 and the edge ring 330 and between the top surface 327 of the cooling ring 320 and the edge ring 330. According to some embodiments, the Si pad 350 may be arranged on the top surface 318 of the heating ring 310 and the top surface 327 of the cooling ring 320 to horizontally surround the substrate supporter 200. In this case, the edge ring 330 may be configured to cover the Si pad 350. According to some embodiments, the Si pad 350 may be configured to adjust transferring of heat between the edge ring 330 and the heating ring 310 and between the edge ring 330 and the cooling ring 320. Accordingly, the amount of by-products deposited on a top surface of the edge ring 330 may be adjusted. For example, the amount of by-products deposited on the first surface 338 may be adjusted.

According to embodiments, the substrate processing device 500 may further include the thermal insulation ring 340 configured to surround the heating ring 310. According to some embodiments, the thermal insulation ring 340 may be configured to prevent heat generated from the heating ring 310 from being transferred to a peripheral member (for example, the substrate supporter 200). For example, the amount of heat energy transferred in a direction toward the central axis of the substrate supporter 200 or a direction away from the central axis of the substrate supporter 200 may be reduced, from the heat energy generated in the heating ring 310. In this case, the amount of heat energy transferred in a direction toward of the top surface 318 of the heating ring 310 may be increased. Accordingly, the amount of power output of a heater required to heat the first surface 338 may be reduced.

According to embodiments, the substrate processing device 500 may include a first thermal insulation ring 342 horizontally surround an inner surface of the heating ring 310 with respect to the central axis of the substrate supporter 200. For example, the first thermal insulation ring 342 may be arranged to horizontally surround the substrate supporter 200, and the heating ring 310 may be arranged to horizontally surround the first thermal insulation ring 342. According to some embodiments, the substrate supporter 200 may be configured to cool the substrate S, and the first thermal insulation ring 342 may be configured to prevent the heat generated from the heating ring 310 from being transferred to the substrate supporter 200 having a relatively low temperature.

According to embodiments, the substrate processing device 500 may include a second thermal insulation ring 344 horizontally surrounding an outer surface of the heating ring 310 with respect to the central axis of the substrate supporter 200. According to some embodiments, the second thermal insulation ring 344 may be configured to reduce the amount of heat energy transferred in a direction from the heating ring 310 to the edge ring 330. According to some embodiments, the edge ring 330 may be configured to cover a top surface of the second thermal insulation ring 344. In this case, a temperature of the first surface 338 may be higher than a temperature of a portion of the edge ring 330 covering the second thermal insulation ring 344, and by-products may be guided to be deposited at a further outer portion than the first surface with respect to the central axis of the substrate supporter 200.

According to embodiments, the cooling ring 320 may be arranged to horizontally surround the second thermal insulation ring 344. In this case, the second thermal insulation ring 344 may prevent the heat generated from the heating ring 310 from being transferred to the cooling ring 320, and thus, the cooling efficiency of the cooling ring 320 may be improved. Accordingly, a temperature of the second surface 337 may be easily adjusted to be lower than a temperature of the first surface 338.

According to embodiments, the thermal insulation ring 340 may include polytetrafluoroethylene (PTFE) and carbon materials. For example, PTFE may have a sheet shape, and the carbon materials may be arranged to surround both surfaces of the PTFE sheet. For example, a cross-section of the thermal insulation ring 340 may have a ternary shape. For example, the carbon materials may be configured to prevent deformation of the thermal insulation ring 340 due to heat and may be provided as a base frame of the thermal insulation ring 340.

According to embodiments, the edge ring 330 may include a focus ring 331, an insulation ring 332, and a cover ring 333.

According to some embodiments, the focus ring 331 may be configured to cover the top surfaces of the heating ring 310, the cooling ring 320, and the thermal insulation ring 340 and horizontally surround the substrate supporter 200. In this case, the first surface 338 may be a top surface of a portion of the focus ring 331 covering the heating ring 310, and the second surface 337 may be a top surface of a portion of the focus ring 331 covering the cooling ring 320. For example, the focus ring 331 may be arranged to have a surface parallel with the substrate S and may be configured to focus plasma on a top surface of the substrate S.

According to some embodiments, a top surface of the focus ring 331 may have a shape having a vertical step difference. For example, the second surface 337 may be at a vertically higher level than the first surface 338. For example, the first surface 338 may be at a vertically lower level than the top surface 208 of the substrate supporter 200, and the second surface 337 may be at a vertically higher level than the top surface 208 of the substrate supporter 200. According to some embodiments, the first surface 338 and the second surface 337 may be connected through an inclined surface. For example, a surface connecting the first surface 338 and the second surface 337 at different levels with each other may have a slide shape, rather than a shape vertical to each of the first and second surfaces 338 and 337. Accordingly, by-products deposited in the edge area E may be easily removed.

The focus ring 331 may be worn out as a plasma process is performed, and thus, a vertical thickness of the focus ring 331 may be decreased. According to some embodiments, the focus ring 331 may be configured to be substituted after being used for a predetermined time period.

According to some embodiments, the insulation ring 332 may be configured to electrically insulate the substrate processing device 500 from a side wall and a bottom wall of the chamber 1. For example, the insulation ring 332 may be configured to horizontally surround outer surfaces of the heating ring 310, the cooling ring 320, and the thermal insulation ring 340. For example, the base plate 400 to be described below may be arranged at bottom surfaces of the substrate supporter 200, the heating ring 310, the cooling ring 320, and the thermal insulation ring 340, and in this case, the insulation ring 332 may be arranged to horizontally surround a side surface of the base plate 400 and cover a bottom surface of the base plate 400. For example, the thermal insulation ring 340 may have a cup shape, and the substrate supporter 200, the heating ring 310, the cooling ring 320, the thermal insulation ring 340, and the base plate 400 may have a shape surrounded by the cup shape.

The side wall of the chamber 1 may be provided as a ground, and plasma may be formed in a space between a side surface of the substrate processing device 500 and the side wall of the chamber 1. According to some embodiments, a cover ring 333 may be configured at the most outer circumference of the substrate processing device 500 to protect the substrate processing device 500 from plasma. For example, the cover ring 333 may include a material having high plasma resistance and high etch resistance.

According to some embodiments, the focus ring 331 may include Si and SiC. According to some embodiments, the cover ring 333 and the insulation ring 332 may include quartz and ceramic. According to some embodiments, the focus ring 331, the insulation ring 332, and the cover ring 333 may have different dielectric rates from each other.

According to embodiments, the base plate 400 may be arranged at bottom surfaces of the substrate supporter 200, the heating ring 310, and the cooling ring 320 and may be configured to receive a radio frequency (RF). For example, the base plate 400 may include an Al alloy and may be electrically connected with an RF power supply portion 426 through an RF cable 424. The RF power supply portion 426 may be configured to generate high-frequency power for generating plasma. For example, the RF power supply portion 426 may include alternating current (AC) power. For example, the AC power may have a frequency of 1 MHz to 100 MHz. A side wall 102, a ceiling 104, and a bottom wall 106 of the chamber 1 may include metal and may be grounded. For example, the RF power may be applied to the base plate 400, and a charged particle included in plasma may be accelerated toward the substrate S.

According to some embodiments, the power supply portions 216 and 316, the RF power supply portion 426, and the coolant tanks 226 and 326 may be arranged outside the chamber 1.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing device comprising:

a substrate supporter configured to support a substrate;

a heating ring horizontally surrounding the substrate supporter;

a cooling ring horizontally surrounding the heating ring; and an edge ring horizontally surrounding the heating ring, wherein the edge ring is configured to cover top surfaces of the heating ring and the cooling ring, wherein the edge ring includes a first surface, which is a top surface of a portion covering the heating ring, and a second surface, which is a top surface of a portion covering the cooling ring, and wherein the second surface is positioned at a vertically higher level than the first surface.

2. The substrate processing device of claim 1, wherein the heating ring comprises a heating electrode arranged to be vertically adjacent to the edge ring.

3. The substrate processing device of claim 2, wherein the heating electrode is configured to horizontally surround the substrate supporter.

4. The substrate processing device of claim 1, further comprising a cooling ring arranged between the heating ring and the edge ring and horizontally surrounding the heating ring, wherein the edge ring is configured to cover a top surface of the cooling ring and the top surface of the heating ring.

5. The substrate processing device of claim 4, wherein the top surface of the cooling ring is at a same vertical level as a top surface of the substrate supporter.

6. The substrate processing device of claim 4, wherein the cooling ring comprises a cooling channel through which a cooling fluid circulates.

7. The substrate processing device of claim 4, further comprising a silicon (Si) pad arranged between the top surface of the heating ring and the edge ring and between the top surface of the cooling ring and the edge ring.

8. The substrate processing device of claim 4, further comprising a thermal insulation ring arranged between the substrate supporter and the heating ring and horizontally surrounding the substrate supporter.

9. The substrate processing device of claim 8, wherein the thermal insulation ring comprises polytetrafluoroethylene and carbon materials.

10. The substrate processing device of claim 1, wherein the substrate supporter is configured to cool the substrate to a temperature in a range of about −60° C. to about −150° C.

11. A substrate processing device comprising:

a substrate supporter configured to support a substrate;

a heating ring horizontally surrounding the substrate supporter;

a cooling ring horizontally surrounding the heating ring; and an edge ring horizontally surrounding the heating ring, wherein the edge ring is configured to cover top surfaces of the heating ring and the cooling ring, wherein the edge ring includes a first surface, which is a top surface of a portion covering the heating ring, and a second surface, which is a top surface of a portion covering the cooling ring, and wherein the second surface is positioned at a vertically higher level than the first surface, wherein the first surface is positioned at a lower vertical level than a top surface of the substrate supporter, such that a gap is formed between the first surface and the substrate.

12. The substrate processing device of claim 11, wherein the heating ring comprises a heating electrode configured to horizontally surround the substrate supporter, and the heating electrode is arranged to be vertically adjacent to the edge ring.

13. The substrate processing device of claim 11, wherein the top surface of the cooling ring is at a same vertical level as a top surface of the substrate supporter.

14. The substrate processing device of claim 11, further comprising:

a first thermal insulation ring horizontally surrounding the substrate supporter between the heating ring and the substrate supporter; and a second thermal insulation ring horizontally surrounding the heating ring between the cooling ring and the heating ring.

15. The substrate processing device of claim 11, wherein a temperature of the first surface is greater than a temperature of the second surface.

16. A substrate processing device comprising:

a substrate supporter comprising a support puck configured to support a substrate on a top surface thereof by generating an electrostatic tensile force and a chuck body arranged on a bottom surface of the support puck and configured to cool the support puck;

a heating ring horizontally surrounding the substrate supporter;

a cooling ring horizontally surrounding the heating ring;

a base plate arranged on bottom surfaces of the substrate supporter, the heating ring, and the cooling ring and configured to receive radio frequency (RF) power; and an edge ring horizontally surrounding the cooling ring and the base plate and configured to cover top surfaces of the heating ring and the cooling ring, wherein the edge ring includes a first surface, which is a top surface of a portion covering the heating ring, and a second surface, which is a top surface of a portion covering the cooling ring, and wherein the second surface is positioned at a vertically higher level than the first surface.

17. The substrate processing device of claim 16, wherein the top surface of the cooling ring is at a same vertical level as a top surface of the support puck.

18. The substrate processing device of claim 16, wherein the cooling ring comprises a second cooling channel through which a coolant circulates, and the base plate comprises a second connection channel connected through the second cooling channel and through which the coolant flows.

19. The substrate processing device of claim 16, wherein the heating ring comprises a heating electrode configured to horizontally surround the substrate supporter, and the heating electrode is electrically connected to a second conductive line surrounded by an insulating material and configured to penetrate the base plate.

* * * * *